(12) United States Patent
Jacques et al.

(10) Patent No.: US 7,085,255 B2
(45) Date of Patent: Aug. 1, 2006

(54) SELECTIVELY ACTIVATED AGC SIGNAL MEASUREMENT UNIT

(75) Inventors: Alexander Jacques, Kings Park, NY (US); Leonid Kazakevich, Plainview, NY (US); Avi Silverberg, Commack, NY (US)

(73) Assignee: InterDigital Technology Corporation, Wilmington, DE (US)

( * ) Notice: Subject to any disclaimer, the term of this patent is extended or adjusted under 35 U.S.C. 154(b) by 783 days.

(21) Appl. No.: 09/872,038

(22) Filed: Jun. 1, 2001

(65) Prior Publication Data

US 2002/0048267 A1   Apr. 25, 2002

Related U.S. Application Data

(60) Provisional application No. 60/241,651, filed on Oct. 19, 2000.

(51) Int. Cl.
*H04B 7/212* (2006.01)

(52) U.S. Cl. .............. 370/347; 370/249; 370/442; 370/498; 375/345; 455/234.1

(58) Field of Classification Search ................ 370/321, 370/326, 336–337, 345, 347, 442, 458, 498; 342/89, 91, 92; 367/65; 375/345; 455/234.1
See application file for complete search history.

(56) References Cited

U.S. PATENT DOCUMENTS

| 5,119,508 | A | | 6/1992 | Shamasundara |
| 5,251,216 | A | * | 10/1993 | Marshall et al. ............ 370/337 |
| 5,331,638 | A | * | 7/1994 | Honkasalo et al. ......... 370/347 |
| 5,361,395 | A | * | 11/1994 | Yamamoto .................. 455/436 |
| 5,638,375 | A | | 6/1997 | Dettro et al. |
| 5,937,377 | A | * | 8/1999 | Hardiman et al. .......... 704/225 |
| 6,070,071 | A | * | 5/2000 | Chavez et al. ........... 455/422.1 |
| 6,240,100 | B1 | * | 5/2001 | Riordan et al. ............. 370/442 |
| 6,430,173 | B1 | * | 8/2002 | Posti et al. ................. 370/347 |
| 6,701,264 | B1 | * | 3/2004 | Caso et al. ................... 702/90 |
| 6,834,185 | B1 | * | 12/2004 | Fujii ....................... 455/232.1 |

FOREIGN PATENT DOCUMENTS

| WO | 91/17606 | 11/1991 |
| WO | 9117606 | 11/1991 |

* cited by examiner

*Primary Examiner*—Brian Nguyen
*Assistant Examiner*—Tri H. Phan
(74) *Attorney, Agent, or Firm*—Volpe and Koenig, P.C.

(57) ABSTRACT

In a TDD wireless communication system between transmitters and associated receivers, automatic gain control of a receiver is only applied during the corresponding time slot within the TDD signal time frame architecture. Successive received signal strengths are measured and gain levels are stored as estimates for an initial gain level in future time slots of the TDD signal. Estimating techniques, such as averaging or trending of received signal strength over successive time slots, and averaging or trending of gain level settings, provide improved estimation of future initial gain levels.

12 Claims, 5 Drawing Sheets

SELECTIVELY ACTIVATED AGC SIGNAL MEASUREMENT UNIT

CROSS REFERENCE TO RELATED APPLICATION

This application claims priority to Provisional Patent Application No. 60/241,651 filed on Oct. 19, 2000.

BACKGROUND

1. Field of the Invention

This invention relates generally to wireless communication systems. More particularly, the invention relates to a method for selectively measuring a received portion of a transmission signal to be applied to an automatic gain control (AGC) system of a receiver.

2. Description of the Prior Art

The time division duplex (TDD) and time division multiplex (TDM) systems of spread spectrum wireless communication operate on the principle of repeating frames of data transmission that are divided into successive time slots. In TDD and TDM wireless systems, there is often a significant and sudden variation in received signal strength between one time slot and the next. This is caused by the fact that different transmitters, with possibly different transmit powers, and possibly vastly different path losses to the associated receiver, operate in consecutive time slots. Furthermore there is typically a so-called "guard" period inserted between time slots, during which no unit in the network is allowed to transmit. This causes another significant and sudden variation in signal strength as the allowed transmission period of one time slot ends, followed by the guard period in which no unit transmits, and then followed again by another transmission in the following time slot.

These sudden and often dramatic variations in received signal strength wreak havoc with traditional automatic gain control (AGC) systems. Such systems are typically employed to adjust the receiver gain so that widely varying signal strengths received at the antenna are reduced to more modest variations in signal strength at the A/D converter, the detector or other devices within the receiver. Without such a reduction in the range of signal strengths, the operation of the A/D converter, the detector or other devices within the receiver can be severely impaired or rendered inoperable.

Conventionally, AGC systems employ closed loop control systems which operate on the continuously received signal. The response speed of such AGC systems must often be limited so as to prevent instability and/or prevent the AGC from eliminating the rapid amplitude variations that are an inherent and essential part of many modulation schemes. Therefore, there are contradictory requirements which, on the one hand, call for a slow AGC response (so as to stabilize the system and not eliminate the essential amplitude variations), and on the other hand, call for a rapid AGC response in order to adjust to the rapidly varying received signal strength. It should also be noted that the information at the beginning of a received time slot, before the AGC has time to properly respond, may be lost or useless. In some systems it has been considered necessary to insert a period at the beginning of a time slot transmission in which no information is sent, even though the transmitter is active. Although this gives the receiver's AGC time to respond, this technique wastes precious bandwidth.

SUMMARY

The present invention is a system or technique in which the automatic gain control of a received TDD or TDM signal for a given receiver is performed only during those specific time slots in which that particular receiver processes transmissions from its associated transmitter. One or more samples of gain control signals are stored until the next recurrence of the specific time slot in a subsequent frame. They are then treated as an estimate of the initial gain level required at the beginning of that subsequent time slot.

The receiver AGC operates at the start of that subsequent time slot under the control of this estimate, derived from measured signal strength made during the same time slot in a preceding frame. In this way, the AGC operation during any given time slot becomes unaffected by excessive signal strength variations from one time slot to the next within a single time frame. The initial setting of the gain control level at the beginning of a specific time slot is especially improved as the AGC operation of the receiver resumes more smoothly over successive time frames.

Further improvement can be obtained by deriving the estimate of initial gain level, not just from a single time slot in a prior frame, but rather from the average of several such prior time slots, or by determining trends in the prior gain control signals.

DETAILED DESCRIPTION

Figure 1:
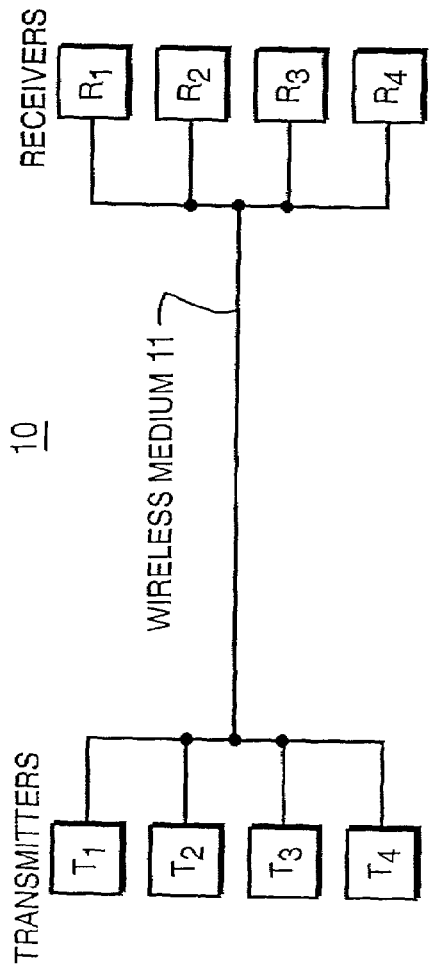
FIG. 1 is a simplified system diagram of a basic TDM system.

Referring to FIG. 1, this shows a typical TDD/TDM system 10. It consists of several transmitters denoted as T1, T2, T3 and T4, and of several receivers, denoted as R1, R2, R3 and R4. The number of transmitters and receivers, four (4) and four (4) respectively (and hence the corresponding number of time slots), is chosen for illustrative purposes and as such, other possible embodiments may comprise a greater or lesser number of time slots, transmitters and receivers. The transmitters T1–T4 and receivers R1–R4 communicate via a wireless medium 11. These communications are so timed such that receiver R1 processes signals from its associated transmitter T1, receiver R2 processes signals from its associated transmitter T2, and so on.

Figure 2:
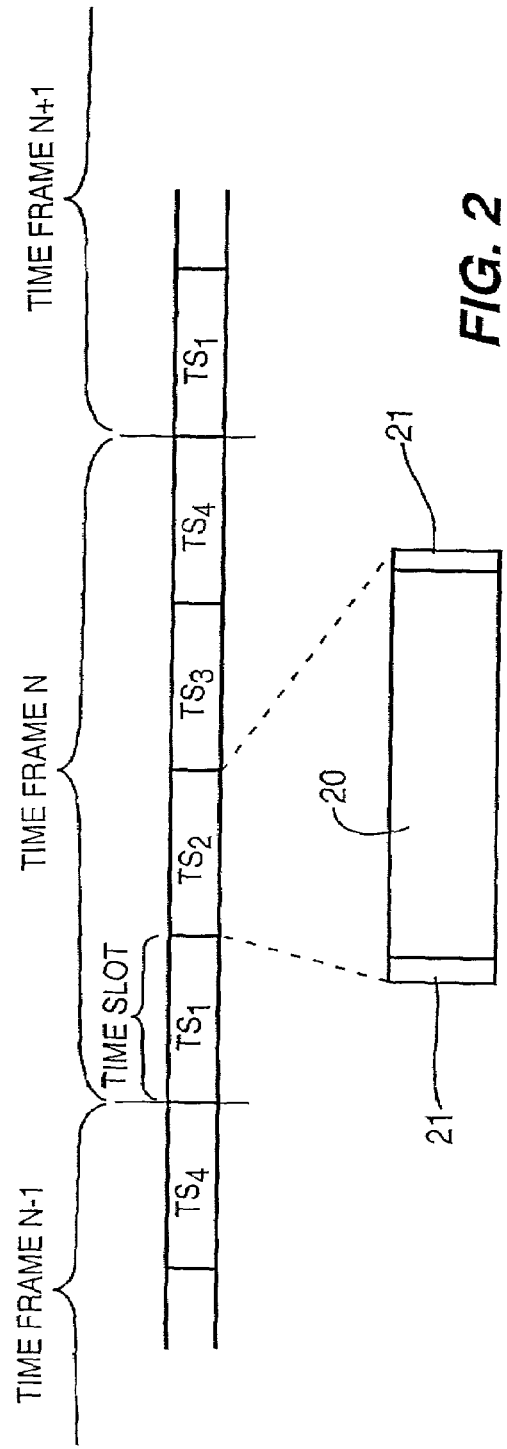
FIG. 2 illustrates the typical signal format used in TDD or TDM architecture.

The timing architecture of these communications between associated transmitters and receivers is illustrated in FIG. 2, which shows a typical time frame N, during which communications between the four associated pairs of transmitters T1–T4 and receivers R1–R4 of FIG. 1 take place. To that end, frame N is subdivided into four consecutive time slots, designated TS1, TS2, TS3 and TS4. During time slot TS1, receiver R1 of FIG. 1 is intended to process signals from transmitter T1 in FIG. 1. During time slot TS2, the same applies to receiver R2 and its associated transmitter T2, and so on for time slots TS3 and TS4. A time frame occurs again and again, each again subdivided into the four time slots shown for frame N. This is indicated in FIG. 2 by showing the last time slot TS4 of the frame N−1 which precedes frame N and the first time slot TS1 of the frame N+1, which follows frame N. The designation of time slots to particular transmitters and receivers is made herein for explanatory purposes. However, it should be understood by those of skill in the art that time slots will be assigned dynamically as needed in accordance with prior art techniques.

Also shown in FIG. 2 is an expanded view of a time slot, using as an example time slot TS2 of frame N. This shows a central portion 20, within which data is transmitted and received, flanked by guard bands 21, during which there is no data transmission or reception. The present invention will operate either with or without guard bands 21.

Figure 3A:
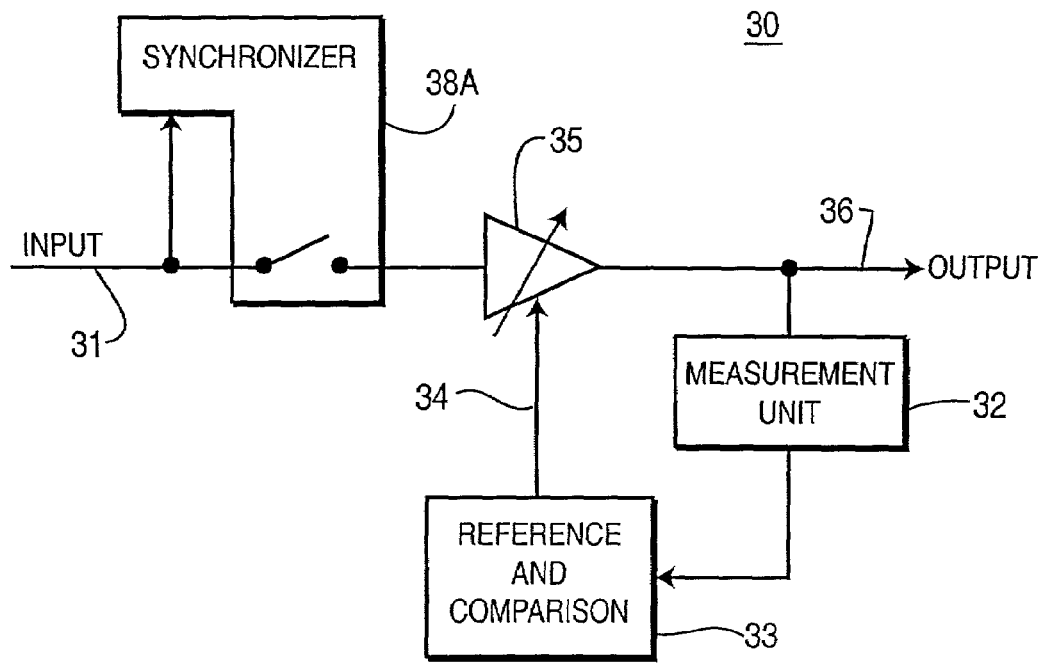
FIGS. 3A, and 3B are simplified block diagrams an AGC system with a gain control signal synchronized to a designated time slot.

Referring now to FIG. 3A, an AGC system 30 is used, for example, in receiver R1 of FIG. 1, responding to designated time slot TS1. The AGC system 30 comprises an input 31, an output 36, a synchronizer 38A, and a closed feedback loop comprising a variable amplifier 35, a measurement unit 32 and a reference and comparison unit 33. The input 31 provides the RF input signal which has been detected by the receiver R1. The RF input signal comprises a plurality of repeating time frames, each including a plurality of time slots TS1–TS4 as shown in FIG. 2. Although FIG. 2 shows four time slots TS1–TS4, those of skill in the art would clearly recognize that more or less time slots could be used as required by the particular application.

The variable amplifier 35 receives the RF input signal from the input 31 and amplifies or attenuates the signal. The measurement unit 32 measures the output of the variable amplifier 35. This measurement is forwarded to the reference and comparison unit 33 which compares the output of the measurement unit 32 with a predetermined reference. As a result of this comparison, the reference and comparison unit 33 outputs an error control signal 34 to the variable amplifier 35 to increase or decrease the amount of amplification or attenuation as desired, to keep the variable amplifier output 36 within a predefined operating range as required by the downstream electronic components (not shown). The synchronizer 38A utilizes a switch to couple the input 31 to the AGC system 30 during time slot TS1 and to decouple the input 31 during all other time slots TS2–TS4. The synchronized input ensures that the input 31 is timely coupled to the AGC system 30 during all occurrences of the applicable time slot, (in this example TS1).

Figure 3B:
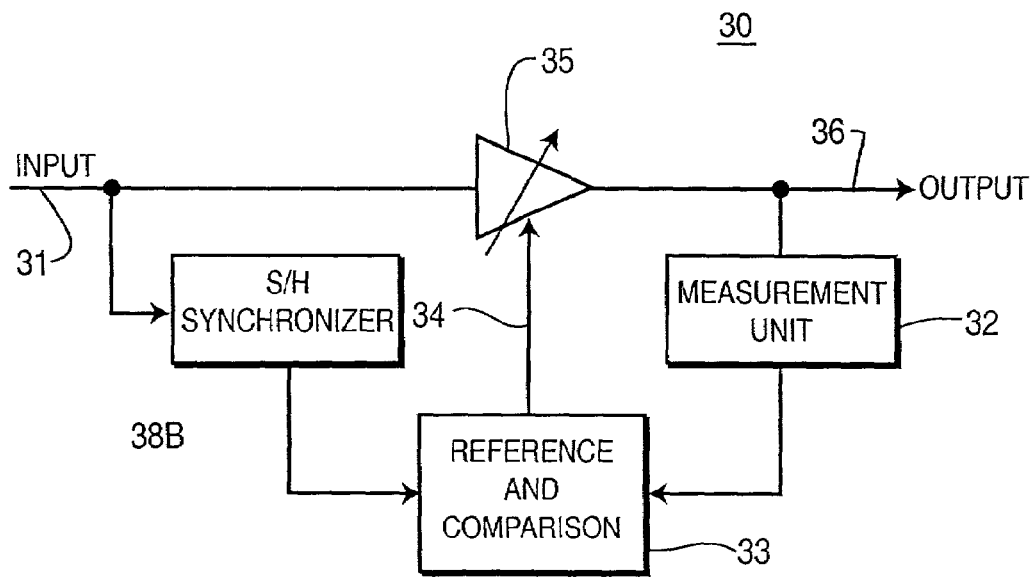

FIG. 3B shows an alternate embodiment wherein the synchronizer 38B comprises a sample and hold unit in which sampling of the input 31 is synchronized to the frequency of time slot TS1. A control signal from the synchronizer 38B selectively overrides the signal generated by the reference and comparison unit 33. During the applicable time slot (i.e. TS1), the synchronizer 38B allows the gain control function provided by the measurement unit 32, the reference and comparison unit 33 and the amplifier 35 to operate normally. During time slots other than TS1, the signal from synchronizer 38B overrides the signal from the reference and comparison unit 33, in order to hold the gain of the variable amplifier 35 at the level that existed at the end of time slot TS1.

By having synchronizer 38A or 38B in the AGC system 30, sampling of the input 31 is synchronized to the occurrence of the desired time slot TS1. This allows the variable amplifier 35 to operate at a level much closer to the required level, particularly at the beginning of the next occurrence of time slot TS1, than would otherwise be possible had the AGC system 30 been allowed to vary across time slots TS1–TS4 from one frame to the next. The result is an improved AGC system 30 with respect to setting the initial gain level during time slot TS1.

Figure 5:
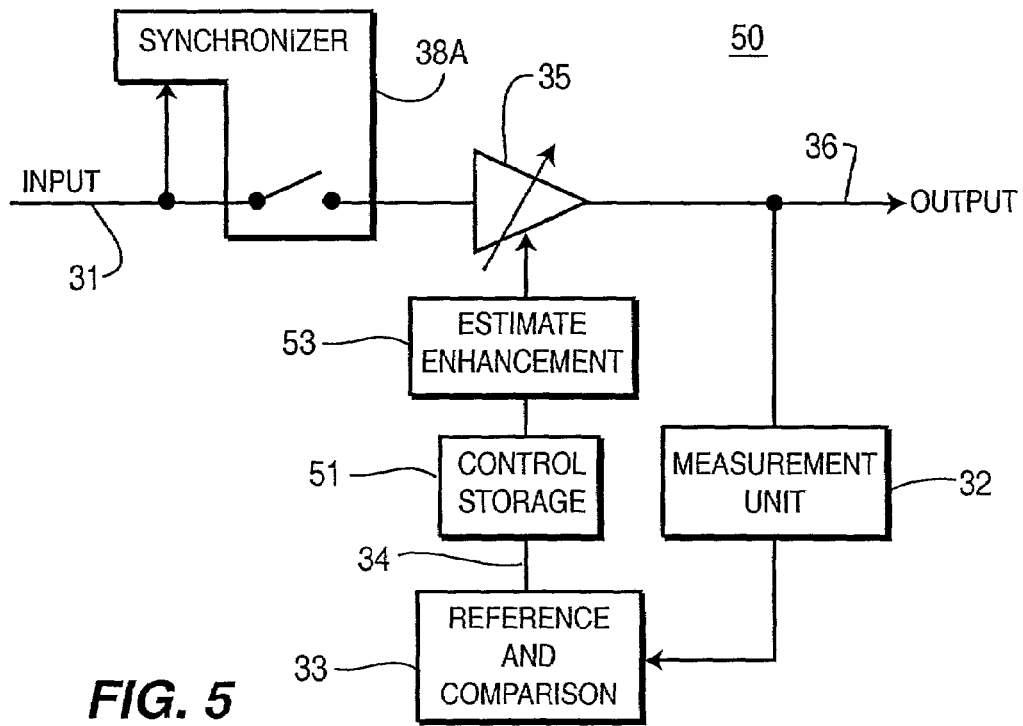
FIG. 5 is a simplified block diagram of an AGC system with means for gain control level storage.

Referring to FIG. 5, an alternate embodiment of an AGC system 50 is shown. This embodiment of the AGC system 50 includes components similar to the prior embodiments, but further includes a control storage unit 51 and an estimate enhancement unit 53. The control storage unit 51 stores the control signal 34 output from the reference and comparison unit 33 for the designated time slot, such as TS1, over several time frames. The stored control signal 34 may comprise a single sample (such as at the end of time slot TS1), or may comprise an average of several samples of the control signal 34 over the entire duration of time slot TS1. This provides a more accurate estimate for time slot TS1 compared with a single sample of signal strength within time slot TS1. The synchronizer 38A, measurement unit 32, reference and comparison unit 33 and variable amplifier 35 all serve the same functions as the corresponding components shown in FIG. 3A.

In a first embodiment of AGC system 50, the estimate enhancement circuit 53 performs calculations of control signals stored in the control storage unit 51, including averaging a sequence of stored control signals derived during the time slot TS1 over several prior time frames. For example, a value of 0.2 for the control signal 34 would be the result of averaging performed on control signal 34 values of 0.1, 0.2, 0.2, 0.3, stored for time slot TS1 over four time frames. In another embodiment, the estimate enhancement circuit 53 may also perform a calculation to determine a rising or falling trend of a sequence of stored control signals 34. For example, a value of 0.5 for the control signal 34 would be the result of a trending calculation performed on control signal 34 values 0.1, 0.2, 0.3, 0.4 of stored values for time slot TS1 over four time frames. Thus, the output of the estimate enhancement circuit 53 provides an improved estimate of the appropriate gain required for the next occurrence of time slot TS1. There are many statistical trending algorithms available in the prior art, and any of these algorithms may be utilized by the present invention. A detailed discussion of such algorithms is outside the scope of the present invention. It should be noted that although the estimate enhancement circuit 53, the control storage unit 51, the reference and comparison unit 33 and the measurement unit 32 are illustrated as separate components, they may be combined together as a single component as desired, such as a microprocessor (not shown). The variable amplifier 35 may also be incorporated into such a microprocessor to provide a single, unitary "smart AGC."

Figure 4:
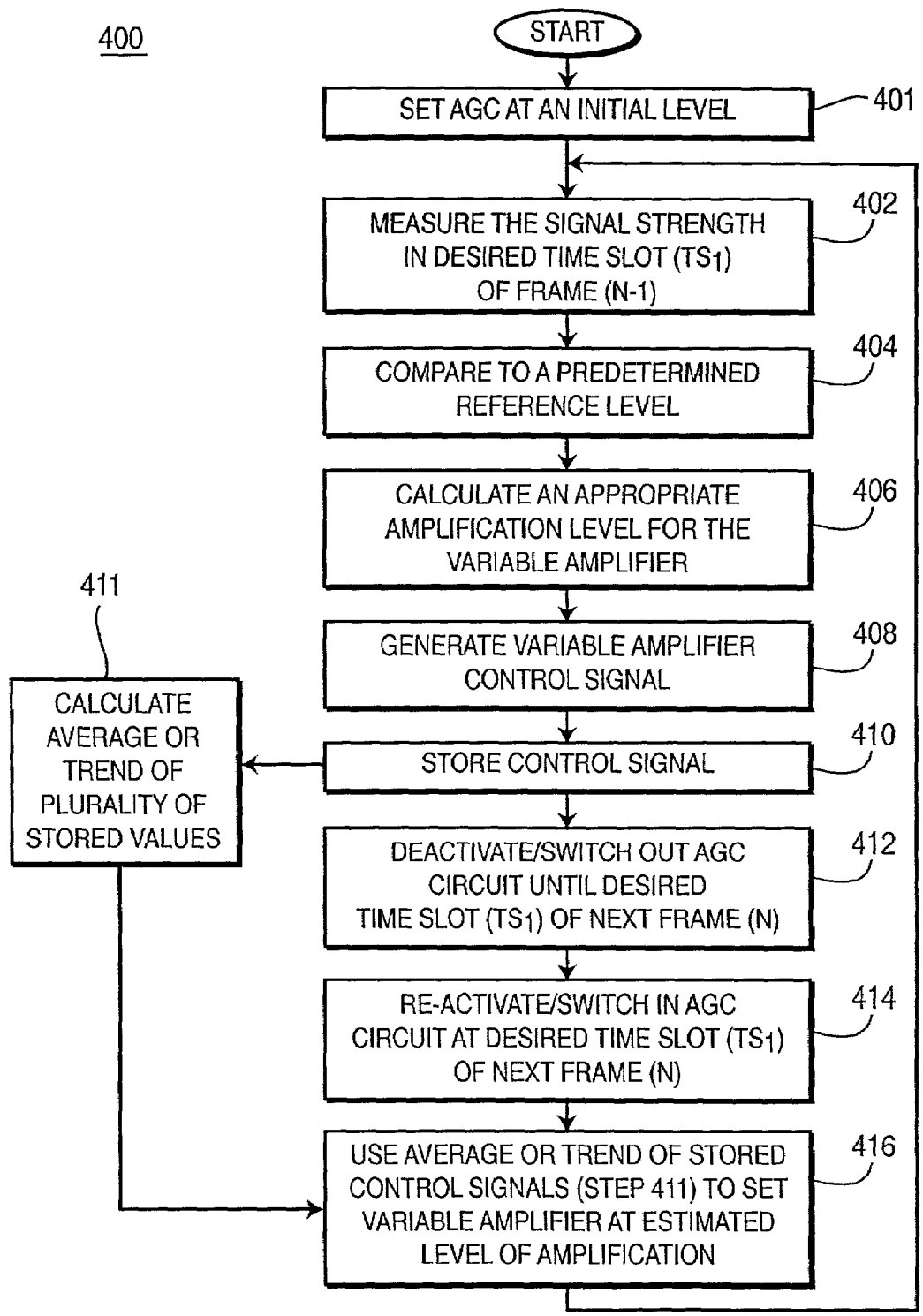
FIG. 4 is a flow chart of the technique performed by the embodiments of FIG. 5.

The process 400 used by each respective receiver R1–R4 to demodulate a signal intended for that particular receiver in accordance with the present invention is shown in the flow diagram of FIG. 4. For this process 400, it is assumed that each receiver R1–R4 has been synchronized to the repeating time frames, and each receiver R1-R4 has also been preassigned to a particular time slot. The prior description notwithstanding, it also should be understood that although a single time slot for each receiver R1-R4 is used as an example for simplicity of explanation, multiple time slots (for example two time slots such as TS1 and TS2, or TS1 and TS3, or even more than two time slots), may be assigned to a particular receiver, (for example R1), for higher data rate communications. The foregoing discussion also assumes that the received RF signal has been downconverted and despread. However, it should be recognized that the individual signals in each time slot may be spread using different spreading codes and, therefore, only the code associated with the desired time slot(s) is despread.

Using the AGC system 50 of FIG. 5 as an example, in step 401, the initial AGC level of an initial time frame is set based on the closed loop feedback as in a typical AGC circuit without the benefit of a stored estimate. The transmitted signal 31 sent from T1 contained in time slot TS1 of frame N−1 is then measured in step 402. Next, in step 404, the signal is compared to a predetermined reference level, and an appropriate amplification or attenuation is calculated in step 406. An error control signal 34 for the variable amplifier 35 is then generated in step 408, based on the result of the calculation step 406, and is also stored in step 410 as an estimate for the next time frame. If desired, an improved estimate of the required control signal for the next time frame is determined in step 411, whereby an average or trend is calculated for a plurality of stored control signals stored over several earlier time frames. However, this is an optional feature and the "unenhanced" control signal stored at step 410 may be utilized for further processing. The AGC system 50 is then "deactivated", "suspended", or "switched out" in step 412, using synchronizer 38A until the next occurrence of TS1 in the subsequent frame is available for measurement, at which point the AGC system 50 is reactivated as shown in step 414. Finally, in step 416, the stored control signal of step 410 (or alternatively, as calculated in step 411) is used to set the variable amplifier 35 at an estimated level of amplification.

As shown in FIG. 4, the process repeats starting at step 402, continuing through step 416 over the course of subsequent time frames, thereby providing a sequence of stored control signals. If an average or trend is calculated, each subsequent reoccurrence of a time slot will update the control signal measurement, thereby providing a "rolling sequence" over a number of consecutive recurring time slots. The average or trend calculation of step 411 is performed on the "rolling sequence" of stored values. Utilizing this procedure, the AGC system 50 will expect the signal level of the next occurrence of TS1 to be within a certain range of the signal level in the prior occurrence of TS1. This permits much more stable and accurate operation of the AGC system 50.

Figure 6:
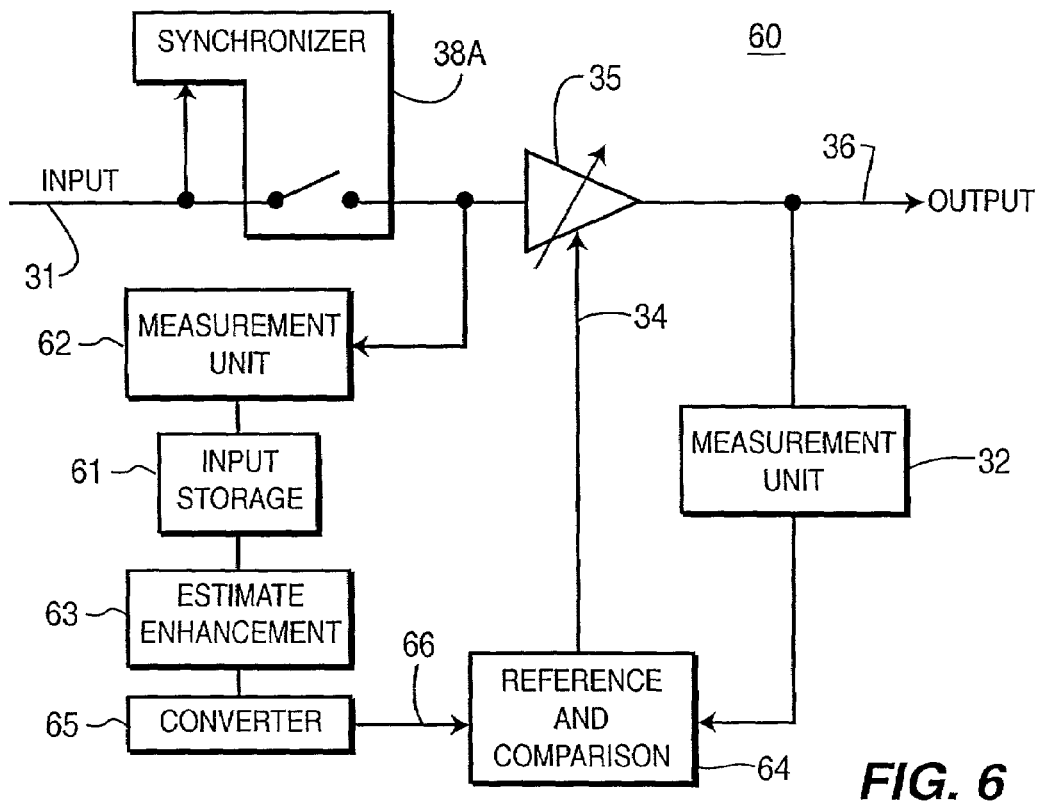
FIG. 6 is a simplified block diagram of an AGC system with means for RF input signal storage.

FIG. 6 shows another alternative embodiment of the present invention. Rather than using feedback on the output 36 of the variable amplifier 35 to determine the control signal for variable amplifier 35, the AGC system 60 analyzes the RF input signal 31 before being processed by the variable amplifier 35. The AGC system 60, also a closed loop type, comprises an input 31, a variable amplifier 35, preamplified a measurement unit 62, a reference and comparison unit 64, storage unit 61, a synchronizer 38A, an estimate enhancement unit 63 and an output 36.

The synchronizer 38A ensures that the AGC system 60 acts on the RF input signal 31 only during the designated time slot for the subject receiver. The preamplified measurement unit 62 measures the receive signal strength of the RF input signal 31. The measured signal strength is then stored by input storage unit 61 for providing an estimate for subsequent receive signal strengths. Over the course of several time frames, a sequence of stored RF input signal strengths are retrieved by the estimate enhancement unit 63, which refines the estimate of the received signal strengths of several earlier occurrences of the designated time slot by analyzing the recorded sequence for increasing or decreasing trends, or by calculating an average of the sequence. This enhanced estimate is forwarded to a converter 65 which converts the refined RF input signal from the estimate enhancement unit 63 into a gain control signal 66 using a predefined target value for the output signal 36. The reference and comparison unit 64 utilizes the estimated gain control signal 66 only at the beginning of each desired time slot to produce the initial error control signal 34 at the beginning of the time slot.

Subsequent to the beginning of the time slot, the measurement unit 32, reference and comparison unit 64 and the variable amplifier 35 operate as a typical AGC circuit to control the gain of the variable amplifier 35 and increase or decrease the amount of amplification or attenuation as required. The output 66 is ignored during this time.

Figure 7A:
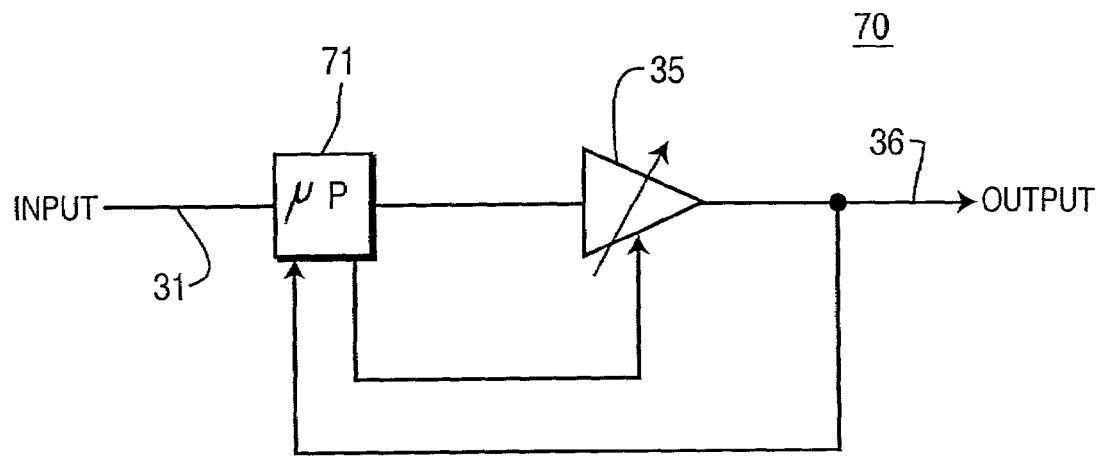
FIG. 7A is an alternative embodiment of FIG. 5 using a microprocessor to incorporate various system functions.
Figure 7B:
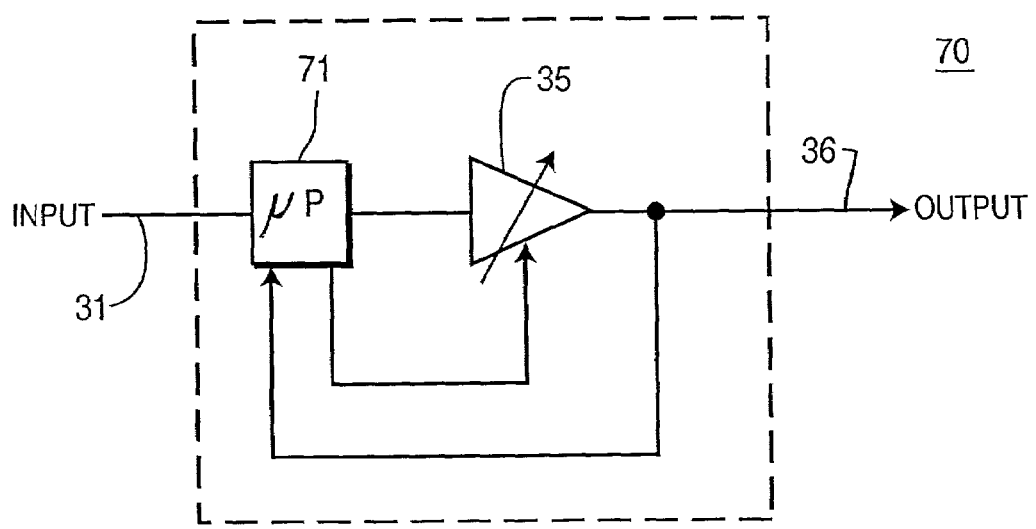
FIG. 7B is an alternative embodiment of FIG. 7A using a microprocessor to additionally include the variable amplifier of the system.

Although the preamplified measurement unit 62, the input storage 61, the estimate enhancement unit 63, the converter 66, the reference and comparison unit 64, the measurement unit 32 and the synchronizer 38A have been described herein as separate and discrete components, it should be noted that they perform functions that may be incorporated as part of a microprocessor 71 having an associated memory (not shown), as illustrated by the embodiment shown in FIG. 7A. The variable amplifier 35 may also be incorporated into the programmed microprocessor 71 to provide a single, unitary "smart AGC", as illustrated in FIG. 7B.

While the present invention has been described in terms of the preferred embodiments, other variations which are within the scope of the invention as outlined in the claims below will be apparent to those skilled in the art.

What is claimed is:

1. In a system for communicating between a plurality of transmitters and a plurality of associated receivers, utilizing repetitive time frames, each time frame subdivided into a plurality of time slots, at least a first time slot allocated to a communication between a first transmitter and a first receiver, at least a second time slot allocated to a communication between a second transmitter and a second receiver, and an $N^{th}$ time slot allocated to a communication between an $N^{th}$ transmitter and an $N^{th}$ receiver, an automatic gain control (AGC) system comprising:

means for measuring, at said first through $N^{th}$ receivers, a received signal strength only during said at least first time slot associated with the respective receiver/transmitter pair, in each of a plurality of successive time frames;

means for utilizing said measured signal strength to set initial gain level settings of said first through $N^{th}$ receivers at said allocated time slot in a subsequent time frame;

means for storing a plurality of said initial gain level settings of successive time frames;

means for determining a trend of the stored initial gain level settings; and means for utilizing said trend to control the gain of said first through $N^{th}$ receivers during the corresponding time slot in the subsequent time frame.

2. The AGC system of claim 1, wherein said subsequent time frame is a next consecutive time frame.

3. The AGC system of claim 1, wherein said AGC system further includes:

means for storing a plurality of gain level settings sampled during said single time frame; and means for averaging said gain level settings to determine a initial gain level of said receivers during the corresponding time slot in the subsequent time frame.

4. The AGC system of claim 1, wherein said AGC system further includes:
   means for determining an average of the stored initial gain level settings; and
   means for utilizing said average to control the gain of said receivers during the corresponding time slot in the subsequent time frame.

5. The AGC system of claim 1, wherein said AGC system further includes:
   means for storing said measured signal strengths; means for determining a trend of the stored signal strengths; and
   means for utilizing said trend to control the gain of said receivers during the corresponding time slot in the subsequent time frame.

6. The AGC system of claim 5 wherein a microprocessor is used for said determining means and both of said utilizing means.

7. The AGC system of claim 1, wherein said AGC system further includes:
   means for storing said measured signal strengths;
   means for determining an average of the stored signal strengths; and
   means for utilizing said average to control the gain of said receivers during the corresponding time slot in the subsequent time frame.

8. The AGC system of claim 7 wherein a microprocessor is used for said determining means and said utilizing means.

9. The AGC method of claim 1, wherein said AGC method further includes:
   storing said measured signal strengths;
   determining an average of the stored signal strengths; and
   utilizing said average to control the gain of said first through $N^{th}$ receivers during the corresponding time slot in the subsequent time frame.

10. In a system for communicating between a plurality of transmitters and a plurality of associated receivers, utilizing repetitive time frames, each time frame subdivided into a plurality of time slots, at least a first time slot allocated to a communication between a first transmitter and a first receiver, at least a second time slot allocated to a communication between a second transmitter and a second receiver, and an $N^{th}$ time slot allocated to a communication between an $N^{th}$ transmitter and an $N^{th}$ receiver, an automatic gain control (AGC) method comprising:
   measuring, at said first through $N^{th}$ receivers, a received signal strength only during said at least first time slot in each of a plurality of successive time frames;
   utilizing said measured signal strength to set initial gain level settings of the first through $N^{th}$ receivers at said at least first time slot in the subsequent time frame;
   storing a plurality of said initial gain level settings of successive time frames;
   determining a trend of the stored initial gain level settings; and
   utilizing said trend to control the gain of said first through $N^{th}$ receivers during a corresponding time slot in a subsequent time frame.

11. The AGC method of claim 10, wherein said AGC method further includes:
   storing a plurality of said initial gain levels settings of successive time frames;
   determining an average of the stored initial gain level settings; and
   utilizing said average to control the gain of said first through $N^{th}$ receivers during the corresponding time slot in the subsequent time frame.

12. The AGC method of claim 10, wherein said AGC method further includes:
   storing said measured signal strengths;
   determining a trend of the stored signal strengths; and
   utilizing said trend to control the gain of said first through $N^{th}$ receivers during the corresponding time slot in the subsequent time frame.

* * * * *

UNITED STATES PATENT AND TRADEMARK OFFICE
CERTIFICATE OF CORRECTION

PATENT NO. : 7,085,255 B2 Page 1 of 1
APPLICATION NO. : 09/872038
DATED : August 1, 2006
INVENTOR(S) : Jacques et al.

It is certified that error appears in the above-identified patent and that said Letters Patent is hereby corrected as shown below:

At FIG.3B, make a line connection between element S/H SYNCHRONIZER and reference numeral 38B.

At column 2, line 34, after the word "diagrams", insert --of--.

At claim 11, column 8, line 24, after the word "gain", delete the word "levels" and insert therefor --level--

Signed and Sealed this

Second Day of January, 2007

JON W. DUDAS
*Director of the United States Patent and Trademark Office*